VOLTAGE CONTROLLED TUNING

Filed May 26, 1966

| CURVE | Cc | $f_v/f_{osc}$ |
|---|---|---|
| 36 | 8 | .66 |
| 37 | 6 | .76 |
| 38 | 6 | .66 |
| 39 | 6 | .62 |
| 40 | 4 | .66 |

INVENTOR
ANTHONY F. KELLER
BY
Mueller, Aichele & Rauner
ATTYS.

United States Patent Office 3,503,011

Patented Mar. 24, 1970

3,503,011

VOLTAGE CONTROLLED TUNING

Anthony F. Keller, Chicago, Ill., assignor to Motorola, Inc., Franklin Park, Ill., a corporation of Illinois Filed May 26, 1966, Ser. No. 553,088
Int. Cl. H03b 3/16
U.S. Cl. 331—177 2 Claims

ABSTRACT OF THE DISCLOSURE

A network for a precision crystal oscillator which allows precise linear variations in frequency with linear variations in voltage applied thereto. The network includes a variable capacitance diode in parallel with a capacitor and coil. Two small capacitors couple the network to the oscillator providing sufficient coupling to allow frequency variation and sufficient isolation to prevent loading of the oscillator, and to further prevent the non-linear characteristics of the variable capacitance diode from effecting the stability of the oscillator.

This invention relates to the vernier tuning of resonant circuits, especially such tuning as provided by a voltage varied capacitance.

In the vernier tuning of resonant circuits, such as those found in the frequency determining portion of high precision crystal oscillators, it is desired to have the frequency change be linearly related to changes in the control voltage. Frequency changes in a tuned circuit are linear with respect to small changes of capacitance in that circuit. Such small changes of capacitance are sufficient to provide vernier tuning in stable precision tuned circuits.

A convenient way to convert a voltage change to a capacitance change is to use a semiconductor diode which exhibits a capacitance that varies with a reverse-biasing voltage applied thereto. Such diodes are well-known in the art and will be hereafter simply referred to as a variable capacitance diode. The capacitance change of such diodes is an inverse square-root function of the corresponding voltage change, and, therefore, is quite non-linear and unsatisfactory for vernier tuning of precision tuned circuits.

Accordingly, it is a prime object of this invention to provide a linear voltage-controlled vernier-tuned circuit having a variable capacitance semiconductor device.

It is a further object of this invention to provide a voltage actuated tuning circuit having few components.

It is another object of this invention to provide a vernier tuning circuit having a variable capacitance semiconductor device and in which the effective capacitance of the circuit varies in an extremely linear manner with respect to the applied control voltage.

This invention provides a linearizing network in which a diode is placed in a circuit tuned to a frequency substantially less than the frequency of the circuit to be controlled, such that the reactance impedance provided to the controlled circuit is entirely capacitive. It is preferred that the ratio of the resonant frequency of the linearizing network be about 0.66 of the resonant frequency of the controlled circuit and that the capactive coupling therebetween be quite small.

Referring now to the drawing.

Figures 1, 2, 3, 4:
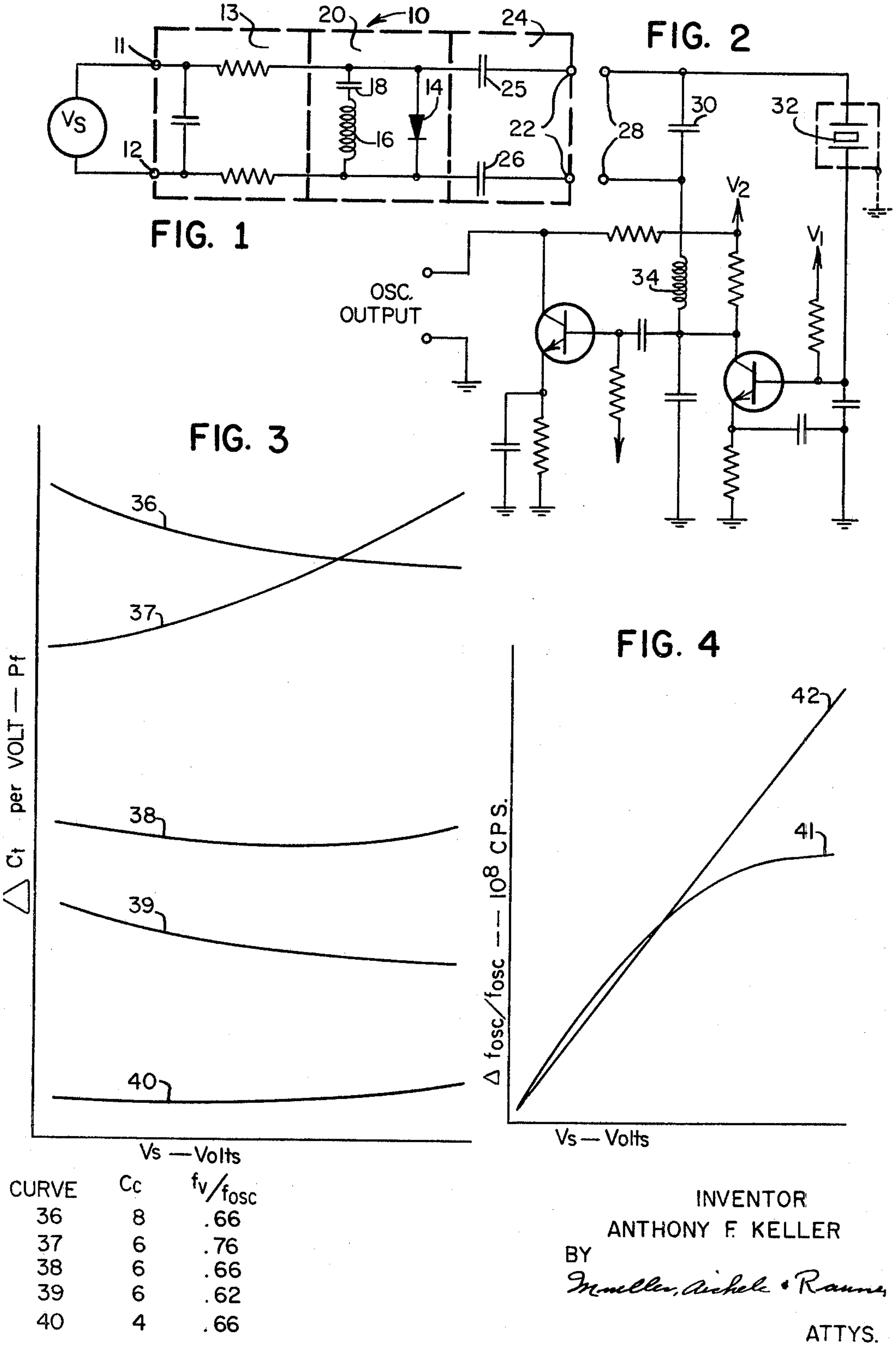
FIG. 1 is a schematic diagram of an exemplary embodiment of a linearizing network constructed according to the teachings of this invention.
FIG. 2 is a diagram showing a crystal oscillator of conventional design and used in conjunction with FIG. 1 network.
FIG. 3 is a graph illustrating the FIG. 1 circuit characteristics in terms of change of effective output capacitance with respect to corresponding voltage changes.
FIG. 4 is a graphical representation of frequency response with respect to applied voltage of the FIG. 2 circuit both with and without the FIG. 1 network.

Referring now to FIG. 1, there is shown a linearlizing network 10 which receives a DC control voltage $V_S$ at its terminals 11 and 12. Such control voltage is applied through filter and current limiting network 13 to the variable capacitance diode 14 such that the DC voltage reverse biases the diode 14. Diode 14 then exhibits a capacitance which corresponds to the applied control voltage in an inverse square-root manner.

The diode 14 is in parallel circuit relation to a series circuit consisting of inductance 16 and DC blocking capacitance 18. The three elements form a resonant circuit 20 having a frequency less than the frequency of the FIG. 2 oscillator to be controlled and therefore appears as a capacitive load to such oscillator.

The effective capacitance of tuned circuit 20 is provided at the linearizing output terminals 22 through intercoupling means 24. The means 24 consists of two small capacitances 26 and 26. The means 24 series capacitance is sufficiently small to prevent loading a connected circuit such as FIG. 2 oscillator.

Referring now to FIG. 2, terminals 28 are connected to terminals 22 of the FIG. 1 network for receiving its effective capacitance. Terminals 28 are connected across the capacitance 30 of the FIG. 2 oscillator frequency-determining portion, which consists of capacitance 30, crystal 32 and inductance 34. Since the oscillator is of conventional design, it will not be further described.

The operation and effect of the FIG. 1 circuit on the FIG. 2 oscillator is best understood by referring to the graphs of FIGS. 3 and 4. The parameters used in the graphs are defined below:

$f_V$—resonant frequency of tuned circuit 20 at the approximate mid-range of control voltage variation.

$f_{osc}$—resonant frequency of the frequency determining portion of the FIG. 2 oscillator, i.e., components 30, 32 and 34.

$C_c$—coupling capacitance of the means 24 consisting of the capacitances 25 and 26. Each capacitance has a value equal to $2C_c$.

$C_t$—the effective capacitance of network 10 as presented at the output terminals 22.

$V_s$—DC control voltage supplied to network 10.

Referring now to FIG. 3 the curves 36, 37, 38, 39 and 40 were derived with the corresponding parameters ($C_c$ and $f_V/f_{osc}$) indicated in the table of such figure and with an oscillator frequency of 3 megacycles.

When used in conjunction with the oscillator of FIG. 2, the ideal response of a network employing a voltage variable capacitance diode would be represented by a horizontal line on the FIG. 3 graph. Of all the curves, curve 38 most closely approaches the ideal response. It is noted that the ratio $f_V/f_{osc}$ is 0.66 and $C_c$=6 pf. (picofarads). The capacitance of the diode 14 at mid-range of control voltage variation was approximately 43 pf. The values given herein are by way of illustration with no limitation thereto intended.

Curve 39 corresponds somewhat to the capacitance-voltage characteristics of the diode 14 in that for a higher control voltage $V_s$ there is a decrease in the slope of curve 39. As such, the characteristics of diode 14 were not completely compensated for. In contradistinction, curve 37 is overcompensated in that the slope increases at a higher control voltage. The diode characteristic compensation in the higher voltage range is somewhat directly proportional to the ratio $f_V/f_{osc}$ in that diode characteristic compensation increases as the ratio increases.

The range of frequency adjustment afforded by the network 10 is indicated by the height of the curves from the horizontal abscissa; that is, the further the distance the curve is from the abscissa, the greater the adjustment. This range of adjustment is somewhat directly proportional to the coupling capacitance $C_c$, for example, curve 40 has the smallest range and the smallest value of $C_c$, 4 pf. (picofarads). Keeping the frequency ratio constant at 0.66 curve 38, corresponding to $C_c$ at 6 pf., has a much greater frequency range of adjustment while curve 36 having the greatest value of $C_c$ (8 pf.) affords the greatest range of adjustment. It may also be noted that the linearity of the curve is somewhat inversely proportional to $C_c$.

Accordingly, it is preferred that $f_v/f_{osc}$ be approximately 0.66.

Referring now to FIG. 4 there is illustrated a frequency response of the FIG. 2 oscillator in an actual test. Curve 41 represents the oscillator frequency response with respect to applied contol voltage when diode 14 is placed across terminals 28 without any linearizing network. Curve 42 was obtained by connecting FIG. 1 network, as taught in this specification, to terminal 28. Curve 42 is a straight line indicating an extremely linear frequency response. In these tests the oscillator frequency was 3 megacycles, the control voltage varied over a range of 8 volts while the rate of change of frequency was $2 \times 10^{-4}$ cycles per second. The coupling capacitance was 6 pf. while diode 14 capacitance was about 43 pf. The above test is described for purpose of illustration with no limitations thereto intended.

Now, therefore, having fully described the invention what I claim to be new and novel is:

1. A voltage tunable circuit including the combination of:

a first tunable circuit comprising a piezoelectric crystal oscillator tuned to a first frequency and adapted to be controlled, a variable capacitance diode exhibiting a capacitance that varies nonlinearily with an applied voltage, means including an inductor and a capacitor serially connected in parallel with said variable capacitance diode to form a second tunable circuit, with the second tunable circuit always having a resonant frequency lower than said first frequency, means for applying a voltage to said variable capacitance diode to vary the capacitance thereof to thereby vary the resonant frequency of the second tunable circuit, a pair of capacitors coupling said second tunable circuit to said first tunable circuit and having values such that said second tunable circuit does not load said piezoelectric first tunable circuit and such that the capacitance of said variable capacitance diode causes said first frequency of said first tunable circuit to vary substantially linearly with respect to variations in voltage applied to said variable capacitance diode.

2. The invention of claim 1 wherein the ratio of the second tunable circuit frequency to the first frequency is about 0.66.

References Cited

UNITED STATES PATENTS

| | | | |
|---|---|---|---|
| 3,382,463 | 5/1968 | Hurtig. | |
| 2,379,201 | 6/1945 | Usselman | 332—26 X |
| 2,438,392 | 3/1948 | Gerber | 332—26 X |
| 2,925,562 | 2/1960 | Firestone | 332—30 |
| 2,972,120 | 2/1961 | Kircher et al. | 332—26 |
| 3,020,493 | 2/1962 | Carroll | 332—16 |
| 3,068,427 | 12/1962 | Weinberg | 334—15 X |
| 3,196,368 | 7/1965 | Potter | 332—30 |
| 3,227,968 | 1/1966 | Brounley | 332—26 |
| 3,256,498 | 6/1966 | Hurtig. | |
| 3,370,255 | 2/1968 | Brower et al. | |
| 3,382,462 | 5/1968 | Davis | 332—26 |

FOREIGN PATENTS

| | | |
|---|---|---|
| 1,195,369 | 6/1965 | Germany. |
| 1,005,937 | 9/1965 | Great Britain. |

HERMAN KARL SAALBACH, Primary Examiner
WM. H. PUNTER, Assistant Examiner

U.S. Cl. X.R.

331—116; 334—15